(12) United States Patent
Yoo et al.

(10) Patent No.: US 10,475,814 B2
(45) Date of Patent: Nov. 12, 2019

(54) FERROELECTRIC MEMORY DEVICES

(71) Applicant: SK hynix Inc., Icheon-si (KR)

(72) Inventors: Hyangkeun Yoo, Icheon-si (KR);
Joong Sik Kim, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/009,471

(22) Filed: Jun. 15, 2018

(65) Prior Publication Data

US 2019/0019800 A1 Jan. 17, 2019

(30) Foreign Application Priority Data

Jul. 14, 2017 (KR) .................. 10-2017-0089923

(51) Int. Cl.
| | |
|---|---|
| *H01L 27/11* | (2006.01) |
| *H01L 27/1159* | (2017.01) |
| *H01L 29/51* | (2006.01) |
| *H01L 29/08* | (2006.01) |
| *G11C 11/22* | (2006.01) |
| *H01L 29/78* | (2006.01) |
| *H01L 21/28* | (2006.01) |
| *H01L 29/66* | (2006.01) |

(52) U.S. Cl.
CPC ........ *H01L 27/1159* (2013.01); *G11C 11/223* (2013.01); *G11C 11/2273* (2013.01); *G11C 11/2275* (2013.01); *H01L 21/28291* (2013.01); *H01L 29/0847* (2013.01); *H01L 29/513* (2013.01); *H01L 29/516* (2013.01); *H01L 29/517* (2013.01); *H01L 29/6684* (2013.01); *H01L 29/78391* (2014.09)

(58) Field of Classification Search
None
See application file for complete search history.

(56) References Cited

U.S. PATENT DOCUMENTS

| | | | |
|---|---|---|---|
| 6,225,655 B1 * | 5/2001 | Moise .................... | G11C 29/44 257/233 |
| 6,825,517 B2 | 11/2004 | Dimmler et al. | |
| 7,973,348 B1 | 7/2011 | Dalton | |
| 9,299,799 B2 * | 3/2016 | Dubourdieu ........ | H01L 29/4966 |
| 2018/0358471 A1 * | 12/2018 | Yoo ................... | H01L 29/78391 |

* cited by examiner

*Primary Examiner* — Fernando L Toledo
*Assistant Examiner* — Valerie N Newton

(57) ABSTRACT

A ferroelectric memory device includes a substrate, an interfacial insulation layer disposed on the substrate, a recombination induction layer disposed on the interfacial insulation layer, a ferroelectric layer disposed on the recombination induction layer, and a gate electrode disposed on the ferroelectric layer. The recombination induction layer includes a material containing holes acting as a majority carrier.

20 Claims, 7 Drawing Sheets

FERROELECTRIC MEMORY DEVICES

CROSS-REFERENCE TO RELATED APPLICATIONS

The present application claims priority under 35 U.S.C 119(a) to Korean Application No. 10-2017-0089923, filed on Jul. 14, 2017, which is herein incorporated by references in its entirety.

BACKGROUND

1. Technical Field

The present disclosure generally relates to ferroelectric memory devices.

2. Related Art

In general, a ferroelectric material may have spontaneous polarization in the absence of an external electric field. In addition, a ferroelectric material may have stable remanent polarizations, which can be opposite to each other on a hysteresis loop, even after application and removal of an external electric field. Accordingly, a ferroelectric material is attractive for a candidate of a material employed in non-volatile memory cells that store data corresponding to a logic "0" and a logic "1".

Recently, a lot of effort has been focused on developing ferroelectric memory devices, including field effect transistor (FET) type memory cells, in which a ferroelectric material is employed as a gate dielectric layer. A write operation in ferroelectric memory devices may be performed by applying a predetermined write voltage to a gate electrode of an FET type memory cell to create a remanent polarization in a gate dielectric layer of the cell. In such a case, a channel resistance value of the FET type memory cell may vary according to the intensity and orientation of the remanent polarization created in the gate dielectric layer of the FET type memory cell. Subsequently, a read operation of the ferroelectric memory devices may be performed by sensing, in an FET type memory cell, a cell current flowing through a channel region, which has a resistance that varies with changing remanent polarization.

SUMMARY

According to an embodiment, there is provided a ferroelectric memory device. The ferroelectric memory device may include a substrate, an interfacial insulation layer disposed on the substrate, a recombination induction layer disposed on the interfacial insulation layer, a ferroelectric layer disposed on the recombination induction layer, and a gate electrode disposed on the ferroelectric layer. The recombination induction layer includes a material containing holes acting as a majority carrier.

According to another embodiment, there is provided a ferroelectric memory device. The ferroelectric memory device may include a semiconductor substrate, a material layer disposed on the semiconductor substrate, a ferroelectric layer disposed on the material layer, a gate electrode disposed on the ferroelectric layer, and a source region and a drain region disposed in the semiconductor substrate to be spaced apart from each other. The material layer contains holes as a majority carrier. The material layer is disposed on the semiconductor substrate approximately between the source region and the drain region.

According to yet another embodiment, there is provided a ferroelectric memory device. The ferroelectric memory device may include a silicon substrate doped with p-type impurities, a silicon oxide layer disposed on the silicon substrate, a semiconductor layer disposed on the silicon oxide layer and doped with P-type impurities acting as a dopant, a ferroelectric layer disposed on the semiconductor layer, a gate electrode disposed on the ferroelectric layer, and a source region and a drain region disposed in the silicon substrate to be spaced apart from each other. The silicon oxide layer is disposed on the silicon substrate substantially between the source region and the drain region, and holes in the semiconductor layer are combined with electrons from the silicon substrate injected into the semiconductor layer.

DETAILED DESCRIPTION OF THE EMBODIMENTS

Figure 1:
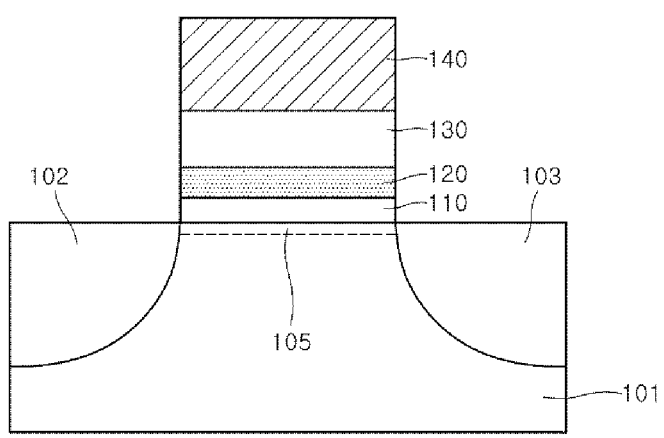
FIG. 1 is a cross-sectional view schematically illustrating a ferroelectric memory device according to an embodiment of the present disclosure.

Various embodiments of the present disclosure will now be described more fully hereinafter with reference to the accompanying drawings. In the drawing figures, the dimensions (e.g., widths or thicknesses) of components (e.g., layers or regions) may be exaggerated for clarity of illustration. It will be understood that when an element is referred to as being "on" another element, it can be directly "on" the other element or intervening elements may also be present. In the drawings, like reference numerals refer to like elements throughout.

As used herein, the singular terms "a," "an" and "the" are intended to include the plural forms as well, unless the context clearly indicates otherwise. It will be understood that the terms "comprise," "comprising," "includes," "including," "have", "having" and variants thereof specify the presence of stated features, integers, steps, operations, elements, and/or components, but do not preclude the presence and/or addition of one or more other features, integers, steps, operations, elements, components, and/or groups thereof. Furthermore, in method embodiments such as fabrication method embodiments, process steps of the methods may be performed in different sequences from the order which is described in the specification unless the context clearly indicates otherwise. That is, the process steps of the methods may be performed in the same sequence as described in the specification or in an opposite sequence thereto. Moreover, two or more process steps sequentially performed in an embodiment may be simultaneously performed in another embodiment.

FIG. 1 is a cross-sectional view schematically illustrating a ferroelectric memory device 1 included in a ferroelectric memory device according to an embodiment of the present disclosure. Referring to FIG. 1, the ferroelectric memory device 1 may include an interfacial insulation layer 110, a recombination induction layer 120, a ferroelectric layer 130 and a gate electrode 140, which are sequentially stacked on a selected portion of a substrate 101. The ferroelectric memory device 1 may be a transistor-type memory cell having a channel resistance value that varies according to a magnitude and orientation or bias of polarization in the ferroelectric layer 130. In addition, a source region 102 and a drain region 103 may be disposed in the substrate 101 to be spaced apart from each other. The interfacial insulation layer 110 may be disposed on the substrate 101 between the source region 102 and the drain region 103.

The ferroelectric memory device 1 may be subject to various operations which are further described hereinafter. If a specific write voltage is applied to the gate electrode 140, the polarization of the ferroelectric layer 130 may be modified to align in a manner consistent with the orientation and magnitude of the write voltage. Even after the write voltage is removed, a remanent polarization having the same direction as the polarization in the ferroelectric layer 130 as driven by the write voltage may be retained in the ferroelectric layer 130. In such a case, the ferroelectric memory device 1 may retain a datum that corresponds to the remanent polarization. For example, the ferroelectric memory device 1 may be regarded as retaining a datum corresponding to a logic "low(0)" level if the remanent polarization in the ferroelectric layer 130 is arrayed in a direction from the gate electrode 140 toward the substrate 101, and the ferroelectric memory device 1 may be regarded as retaining a datum corresponding to a logic "high(1)" level if the remanent polarization in the ferroelectric layer 130 is arrayed in a direction from the substrate 101 toward the gate electrode 140.

The remanent polarization in the ferroelectric layer 130 may induce migration of electrons or holes into or out of a channel region 105 of the substrate 101, which is located between the source region 102 and the drain region 103. A channel resistance value of the channel region 105 may vary depending on the amount of charge, including the charges induced into the region. When a read voltage is applied to the gate electrode 140 in a read mode, the datum stored in the ferroelectric memory device 1 may be read, and the datum and the cell current passing through channel region 105 may be measured or determined with a sense amplifier (not shown) electrically connected to the drain region 103. For example, if the substrate 101 is a P-type substrate, and the source region 102 and the drain region 103 are N-type regions, then the ferroelectric memory device 1 retains a datum corresponding to a logic "low (0)" level. Electrons may be induced by the remanent polarization in the ferroelectric layer 130, and the electrons may migrate into the channel region 105, effectively reducing the channel resistance value between the source region 102 and the drain region 103. Thus, in the read mode, a cell current flowing through the channel region 105 may be relatively large. In contrast, when the ferroelectric memory device 1 retains a datum corresponding to a logic "high (1)" level, electrons may be repelled from the channel region 105 by the remanent polarization in the ferroelectric layer 130, and the channel resistance value between the source region 102 and the drain region 103 increases. Thus, in the read mode, a cell current flowing through the channel region 105 may be relatively small.

The substrate 101 may include a semiconductor substrate. For example, the substrate 101 may be a silicon (Si) substrate, a gallium arsenide (GaAs) substrate, an indium phosphide (InP) substrate, a germanium (Ge) substrate or a silicon germanium (SiGe) substrate, as non-limiting examples. In an embodiment, the substrate 101 may be doped with impurities to have a conductivity type. For example, the substrate 101 may be doped with P-type impurities to provide a P-type substrate. In another embodiment, the substrate 101 may include a P-type well (not shown) formed in the substrate 101 to surround at least the channel region 105.

As illustrated in FIG. 1, the source region 102 and the drain region 103 may be disposed at either side or ends of the channel region 105. In an embodiment, if the substrate 101 is doped with P-type impurities, the source region 102 and the drain region 103 may be doped with N-type impurities.

The interfacial insulation layer 110 may be disposed on the substrate 101, and the interfacial insulation layer 110 may have an amorphous structure. The interfacial insulation layer 110 may be disposed between the substrate 101 and the ferroelectric layer 130 to suppress or block inter-diffusion of atoms between the substrate 101 and the ferroelectric layer 130. In addition, the interfacial insulation layer 110 may prevent the direct contact between the substrate 101 and the ferroelectric layer 130, which have different lattice constants, to minimize crystal defects that form at an interface between the substrate 101 and the ferroelectric layer 130 due to lattice strain.

The interfacial insulation layer 110 may include, for example, a silicon oxide (SiO) material, a silicon nitride (SiN) material, a silicon oxynitride (SiON) material, an aluminum oxide (AlO) material or a combination material containing at least two different materials thereof. In an embodiment, if the substrate 101 is a silicon substrate, the interfacial insulation layer 110 may be a silicon oxide (SiO) layer, a silicon nitride (SiN) layer, a silicon oxynitride (SiON) layer or a combination material containing at least two of SiO, SiN and SiON.

The recombination induction layer 120 may be disposed on the interfacial insulation layer 110 opposite to or on the other side of the substrate 101. The recombination induction layer 120 may include a material containing holes as a majority carrier. That is, the recombination induction layer 120 may contain holes as a majority carrier and electrons as a minority carrier. The carriers may drift in an electric field applied across the recombination induction layer 120.

In an embodiment, the recombination induction layer 120 may include a metal oxide material having a non-stoichiometric composition, i.e., a formulaic composition whose elements are not in balance with respect to valence electrons. For example, the recombination induction layer 120 may include a nickel oxide ($NiO_x$) material. Alternatively, the recombination induction layer 120 may include a PCMO ($Pr_xCa_{1-x}MnO_3$) material, as another example.

In another embodiment, the recombination induction layer 120 may include a semiconductor material doped with P-type impurities. In such a case, the semiconductor material may include a silicon (Si) material, a germanium (Ge) material, a gallium nitride (GaN) material, a gallium arsenide (GaAs) material or a combination material containing at least two different materials thereof. For example, if the recombination induction layer 120 includes a silicon (Si) material or a germanium (Ge) material, then the P-type impurities injected into the recombination induction layer 120 may include boron (B) ions or aluminum (Al) ions. In another example, if the recombination induction layer 120 includes a gallium nitride (GaN) material, then the P-type impurities injected into the recombination induction layer 120 may include magnesium (Mg) ions or zinc (Zn) ions. In a further example, if the recombination induction layer 120 includes a gallium arsenide (GaAs) material, then the P-type impurities injected into the recombination induction layer 120 may include silicon (Si) ions or zinc (Zn) ions.

The recombination induction layer 120 may be electrically floated while the ferroelectric memory device 1 operates in a write mode, a read mode or in other modes. The holes in the recombination induction layer 120 may combine with electrons introduced into recombination induction layer 120 from substrate 101, lowering the number of electrons in the recombination induction layer 120. Thus, when the ferroelectric memory device 1 operates in a write mode or a read mode, the recombination induction layer 120 may act as a barrier to electrons and limit or prevent electrons from injecting or tunneling into the ferroelectric layer 130 from substrate 101. The recombination induction layer 120 may further, or in the alternative, reduce the number of electrons or stop electrons tunneling or migrating from the substrate 101 from being captured in trap sites that form at an interface between the recombination induction layer 120 and the ferroelectric layer 130. The recombination induction layer 120 may have a thickness of approximately one (1) nanometer (nm) to approximately five (5) nm.

The ferroelectric layer 130 may be disposed on the recombination induction layer 120 opposite to or on the other side of the interfacial insulation layer 110. The ferroelectric layer 130 may include a ferroelectric material which is capable of retaining a remanent polarization. In an embodiment, the remanent polarization in the ferroelectric layer 130 may induce electrons into the channel region 105 of the substrate 101 when the remanent polarization has a polarization direction from the gate electrode 140 toward the substrate 101. In such a case, when the ferroelectric memory device 1 operates in a read mode, a channel resistance value between the source region 102 and the drain region 103 depend on a concentration of the electrons induced to migrate into the channel region 105 by the remanent polarization. The ferroelectric layer 130 may have a thickness of approximately five (5) nm to approximately ten (10) nm.

In an embodiment, the ferroelectric layer 130 may include a metal oxide material having a crystalline structure. The ferroelectric layer 130 may include a binary metal oxide material. For example, the ferroelectric layer 130 may include a hafnium oxide (HfO) material, a zirconium oxide (ZrO) material or a combination thereof.

In an embodiment, the ferroelectric layer 130 may include at least one dopant. The dopant distributed in the ferroelectric layer 130 may be provided to stabilize a ferroelectric property of the ferroelectric layer 130. If the ferroelectric layer 130 includes a binary metal oxide material, then the ferroelectric layer 130 may be doped with a dopant having a valence of two to four. For example, the dopant of the ferroelectric layer 130 may include at least one of carbon (C), silicon (Si), magnesium (Mg), aluminum (Al), yttrium (Y), germanium (Ge), tin (Sn), strontium (Sr), lead (Pb), calcium (Ca), barium (Ba), titanium (Ti), zirconium (Zr), gadolinium (Gd) and lanthanum (La).

The gate electrode 140 may be disposed on the ferroelectric layer 130 opposite to the recombination induction layer 120. The gate electrode 140 may include a conductive material. For example, the gate electrode 140 may include a tungsten (W) material, a titanium (Ti) material, a copper (Cu) material, an aluminum (Al) material, a platinum (Pt) material, an iridium (Ir) material, a ruthenium (Ru) material, a tungsten nitride (WN) material, a titanium nitride (TiN) material, a tantalum nitride (TaN) material, an iridium oxide (IrO) material, a ruthenium oxide (RuO) material, a tungsten carbide (WC) material, a titanium carbide (TiC) material, a tungsten silicide (WSi) material, a titanium silicide (TiSi) material, a tantalum silicide (TaSi) material or a combination material containing at least two different materials thereof.

As described above, the ferroelectric memory device 1 according to an embodiment may include a recombination induction layer 120, containing holes as a majority carrier, disposed between the interfacial insulation layer 110 and the ferroelectric layer 130. If electrons in the substrate 101 are injected into or tunnel into the recombination induction layer 120 while the ferroelectric memory device 1 operates in a read mode or a write mode, then the holes in the recombination induction layer 120 may combine with the electrons to stop or limit leakage current.

Accordingly, because majority carriers in the recombination induction layer 120 combine with electrons moving in from substrate 101, fewer electrons are available to trap in interfacial defect sites that form between the ferroelectric layer 130 and a heterogeneous material layer (e.g., the recombination induction layer 120) in contact with the ferroelectric layer 130. As a result, the recombination induction layer 120 may suppress or limit generation of a leakage current flowing through the ferroelectric layer 130, which tends to degrade fatigue and other characteristics of the ferroelectric layer 130. Improved reliability of the ferroelectric memory device 1 results.

Figure 2:
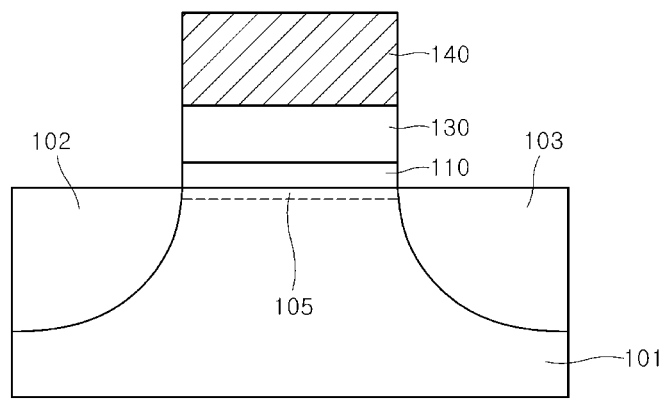
FIG. 2 is a cross-sectional view schematically illustrating a ferroelectric memory device according to a comparative example of the present disclosure.

FIG. 2 is a cross-sectional view schematically illustrating a ferroelectric memory device 2 according to a comparative example of the present disclosure. Referring to FIG. 2, the ferroelectric memory device 2 is missing the recombination induction layer 120 as compared with the ferroelectric memory device 1 illustrated in FIG. 1. Thus, the interfacial insulation layer 110 and the ferroelectric layer 130 may be in direct contact with each other, and defects created by lattice strain form at the interface between the layers. That is, the ferroelectric memory device 2 may have substantially the same configuration as the ferroelectric memory device 1 illustrated in FIG. 1, except that the interfacial insulation layer 110 and the ferroelectric layer 130 are in direct contact with each other in the absence of the recombination induction layer 120 illustrated in FIG. 1.

Figure 3:
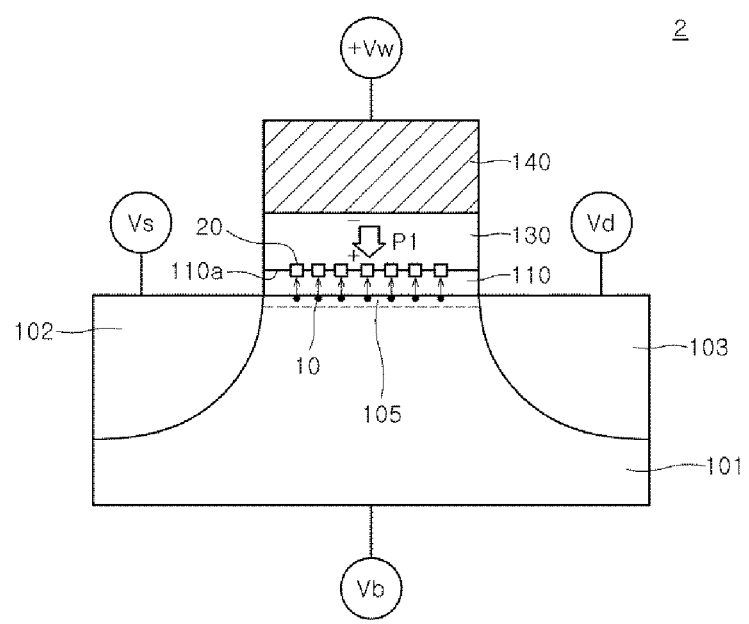
FIGS. 3 to 5 are cross-sectional views schematically illustrating operations of a ferroelectric memory device according to a comparative example of the present disclosure.
Figure 4:
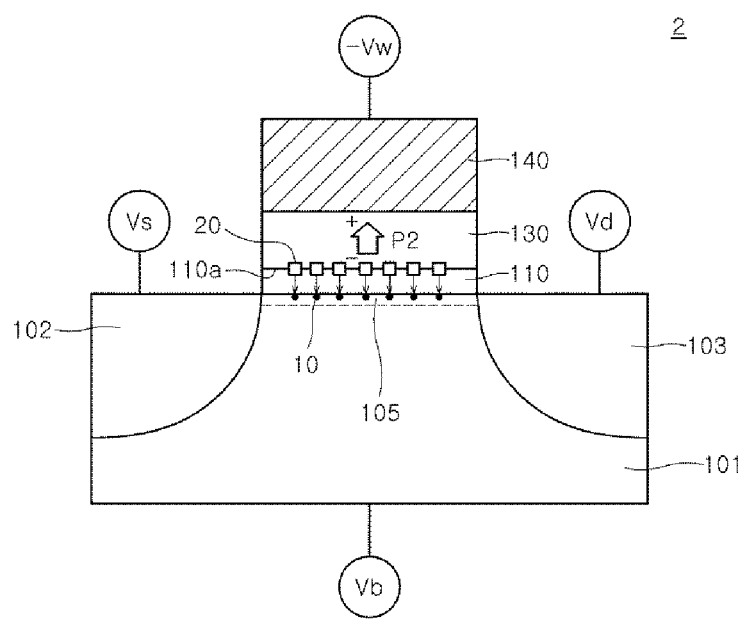
Figure 5:
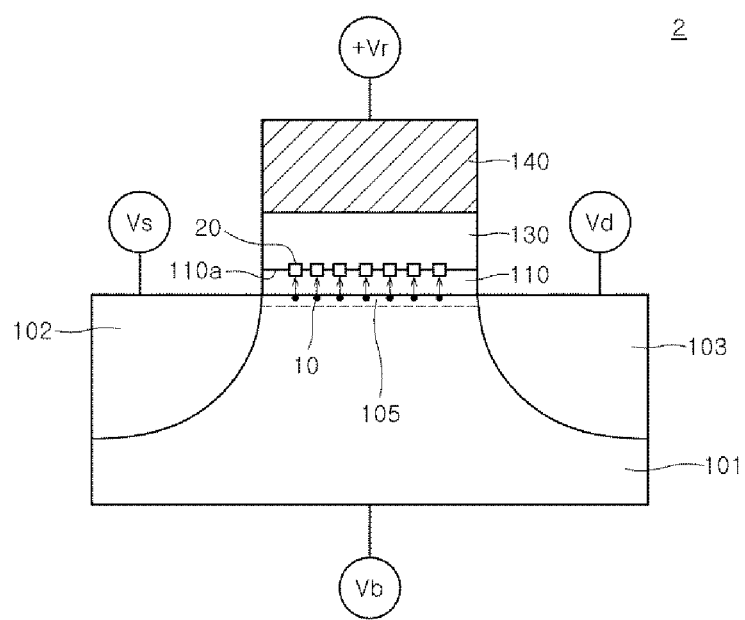

FIGS. 3 to 5 are cross-sectional views schematically illustrating operations of the ferroelectric memory device 2 illustrated in FIG. 2. Specifically, FIGS. 3 and 4 are cross-sectional views schematically illustrating a first write operation and a second write operation of the ferroelectric memory device 2, respectively, and FIG. 5 is a cross-sectional view schematically illustrating a read operation of the ferroelectric memory device 2.

Referring to FIG. 3, a first write voltage +Vw having a positive polarity may be applied to the gate electrode 140. In such a case, a source voltage Vs and a drain voltage Vd may be applied to the source region 102 and the drain region 103, respectively. In addition, a substrate voltage Vb may be applied to the substrate 101. The source voltage Vs, the drain voltage Vd and the substrate voltage Vb may be a ground voltage. That is, the source region 102, the drain region 103 and the substrate 101 may be electrically grounded.

A first polarization arrayed in a first direction P1 may be formed in the ferroelectric layer 130 under the above bias condition. The first direction P1 may be oriented from the gate electrode 140 toward the substrate 101. In addition, electrons 10 in the channel region 105 of the substrate 101 are attracted towards ferroelectric layer 130 and move through the interfacial insulation layer 110, in electric fields produced by the first write voltage +Vw and the first polarization. A portion of the electrons 10 may be trapped in defect sites 20 at an interface 110a between the interfacial insulation layer 110 and the ferroelectric layer 130. While the first write voltage +Vw is applied to the gate electrode 140, the electrons 10 may penetrate the interfacial insulation layer 110 by a tunneling mechanism, such as Fowler-Nordheim tunneling, as an example.

If the electrons 10 are trapped in defect sites 20 at the interface 110a, the electrons 10 may react with positive charges collecting at or near a surface of the ferroelectric layer 130 adjacent to the interface 110a. The positive charges migrate and aggregate consistent with an electric field generated by the write voltage +Vw and polarization P1, and by reacting with the injected electrons, reduces the density of the positive charges in the ferroelectric layer 130. Accordingly, an intensity of the first polarization having the first direction P1 may be reduced or lowered during the first write operation. After the first write voltage +Vw is removed, the electrons 10 may remain in the defect sites 20. Alternatively, the electrons 10 trapped in the defect sites 20 may return to the substrate 101 through the interfacial insulation layer 110.

Referring to FIG. 4, a second write voltage −Vw having a negative polarity may be applied to the gate electrode 140. In such a case, the source voltage Vs and the drain voltage Vd may be applied to the source region 102 and the drain region 103, respectively. In addition, the substrate voltage Vb may be applied to the substrate 101. The source voltage Vs, the drain voltage Vd and the substrate voltage Vb may be a ground voltage. That is, the source region 102, the drain region 103 and the substrate 101 may be electrically grounded.

A second polarization arrayed in a second, opposite direction P2 may be formed in the ferroelectric layer 130 under the above bias condition. The second direction P2 may be oriented from the substrate 101 toward the gate electrode 140. In addition, the electrons 10 previously trapped in the defect sites 20 at the interface 110a may be released from the defect sites 20 in response to electric fields created by the second write voltage −Vw, and the second polarization. The electrons 10 move toward the substrate 101 and through the interfacial insulation layer 110. At this time, the electrons 10 may penetrate the interfacial insulation layer 110 by a tunneling mechanism such that the electrons 10 may move toward the substrate 101.

If the electrons 10 are released from the defect sites 20 existing at the interface 110a, then the defect sites 20 may remain as a vacancy and have positive charges. At this time, negative charges induced at inner regions of the ferroelectric layer 130 adjacent to the interface 110a by the second polarization P2 may fill the defect sites 20 remaining as the vacancy. Alternatively, the induced negative charges may react electrically with the defect sites 20 as the vacancy. As shown in FIG. 4, the second polarization P2 may induce negative charges at the inner regions of the ferroelectric layer 130 near the interface 110a and positive charges at the inner regions of the ferroelectric layer 130 near an interface between the ferroelectric layer 130 and the gate electrode 140. As a result, a density of the negative charges in the ferroelectric layer 130 may be reduced and an intensity of the second polarization having the second direction P2 may be reduced during the second write operation.

If the number of the first and second write operations of the ferroelectric memory device 2 are performed repeatedly by cycling between the first and second write voltages +Vw and −Vw, then an intensity or magnitude of the polarization switched in the ferroelectric layer 130 may be gradually degrade. That is, as the polarization switching repeats, reproducibility of the polarization switching may decrease due to a reaction between the defect sites 20 having charges and the induced charges by the polarizations P1 and P2. As a result, a fatigue characteristic of the ferroelectric memory device 2 may be degraded.

Referring to FIG. 5, a read voltage +Vr having a positive polarity may be applied to the gate electrode 140. The source voltage Vs having a ground voltage and the substrate voltage Vb having a ground voltage may be applied to the source region 102 and the substrate 101, respectively. That is, the source region 102 and the substrate 10 may be electrically grounded. While the read operation, the drain voltage Vd applied to the drain region 103 may be a positive voltage.

When the read voltage +Vr is applied to the gate electrode 140, a channel region 105 has a resistance value that is modified by the electrons 10 induced into the channel region 105 by remanent polarization in the ferroelectric layer 130. The electrons 10 may drift toward the drain region 103 along the channel region 105 due to a voltage difference between the source region 102 and the drain region 103. A portion of the electrons 10 drifting in the channel region 105 may move away from the channel region 105 toward the gate electrode 140 in response to an electric field created by the read voltage +Vr. That is, the electrons 10 may penetrate the interfacial insulation layer 110 to reach the interface 110a and become trapped in the defect sites 20 at the interface 110a. While the read voltage +Vr is applied to the gate electrode 140, the electrons 10 may penetrate the interfacial insulation layer 110 by a tunneling mechanism.

The electrons 10 trapped in the defect sites 20 may reduce the intensity of the remanent polarization in the ferroelectric layer 130. After the read voltage +Vr is removed, the electrons 10 trapped in the defect sites 20 may remain in the defect sites 20. Alternatively, the electrons 10 are released and may return to the substrate 101 through the interfacial insulation layer 110.

Figure 6:
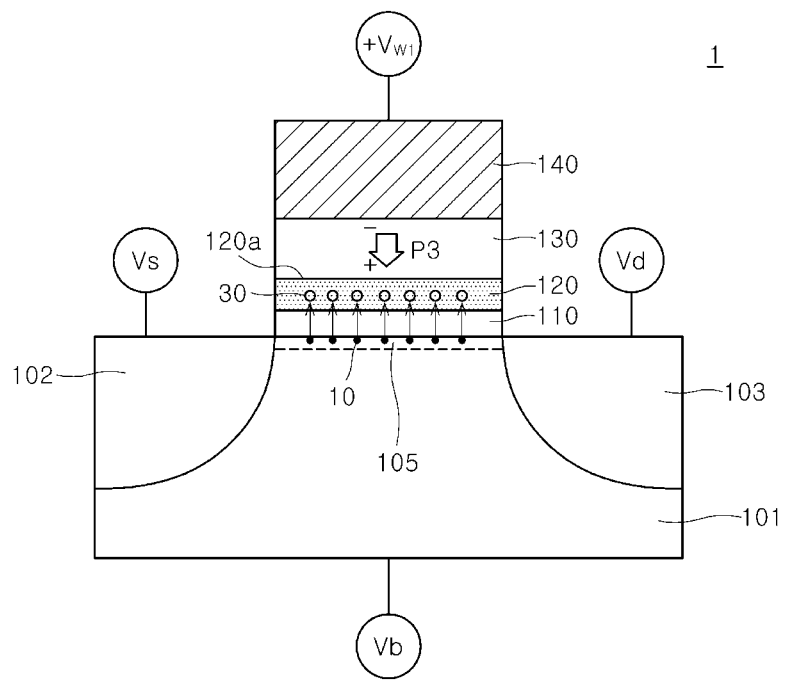
FIGS. 6 and 7 are cross-sectional views schematically illustrating operations of a ferroelectric memory device according to an embodiment of the present disclosure.
Figure 7:
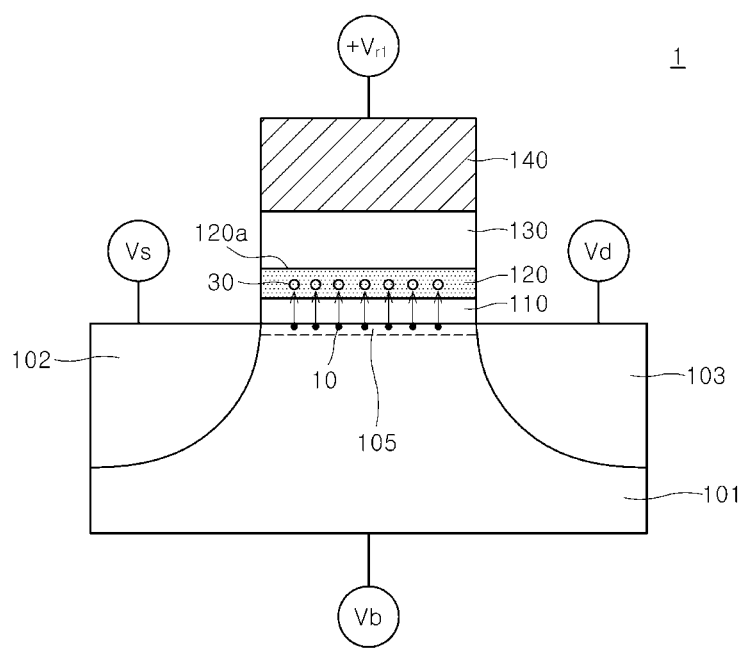

FIGS. 6 and 7 are cross-sectional views schematically illustrating operations of a ferroelectric memory device according to an embodiment of the present disclosure. Specifically, FIG. 6 illustrates a write operation of the ferroelectric memory device 1 shown in FIG. 1, and FIG. 7 illustrates a read operation of the ferroelectric memory device 1 shown in FIG. 1.

Referring to FIG. 6, a write voltage +Vw1 having a positive polarity may be applied to the gate electrode 140. In such a case, the source voltage Vs and the drain voltage Vd having a ground voltage may be applied to the source region 102 and the drain region 103, respectively. In addition, the substrate voltage Vb having a ground voltage may be applied to the substrate 101. That is, the source region 102, the drain region 103 and the substrate 101 may be electrically grounded.

A first polarization arrayed in a first direction P3 may be formed in the ferroelectric layer 130 by the write voltage +Vw1. The first direction P3 may be a direction oriented from the gate electrode 140 toward the substrate 101. When the write voltage +Vw1 is applied to the gate electrode 140, the electrons 10 in the channel region 105 of the substrate 101 may inject or tunnel into the recombination induction layer 120 through the interfacial insulation layer 110. The recombination induction layer 120 may have holes 30 acting as a majority carrier. The holes 30 in the recombination induction layer 120 may combine with the electrons 10 injected into the recombination induction layer 120, interrupting the movement of the electrons 10 towards gate electrode layer 140. Thus, the recombination induction layer 120 may suppress or limit movement of the electrons 10 toward an interface 120a between the recombination induction layer 120 and the ferroelectric layer 130, by trapping electrons 10 and by combining the electrons 10 and the holes 30 in the recombination induction layer 120. Accordingly, the recombination induction layer 120 blocks electrons from modifying the intensity or magnitude of the polarization in the ferroelectric layer 130.

Referring to FIG. 7, a read voltage +Vr1 having a positive polarity may be applied to the gate electrode 140. In such a case, the source voltage having a ground voltage and the substrate voltage Vb having a ground voltage may be applied to the source region 102 and the substrate 101, respectively. That is, the source region 102 and the substrate 101 may be electrically grounded. The drain voltage Vd having a positive polarity may be applied to the drain region 103.

When a read voltage +Vr1 is applied to the gate electrode 140, a channel region 105 has a resistance value that is modified by the electrons 10 induced into the channel region 105 by remanent polarization in the ferroelectric layer 130. The electrons 10 may drift toward the drain region 103 along the channel region 105 due to a voltage difference between the source region 102 and the drain region 103. A portion of the electrons 10 drifting along in the channel region 105 may move away from the channel region 105 toward the gate electrode 140 in response to an electric field created by the read voltage +Vr1. That is, the electrons 10 may be injected into the recombination induction layer 120 through the interfacial insulation layer 110 and combine with the holes 30 in the recombination induction layer 120. As a result, the recombination induction layer 120 may interrupt that the electrons 10 are injected into the ferroelectric layer 130. Recombination of the electrons 10 and the holes 30 may be executed in the recombination induction layer 120. Thus, the recombination induction layer 120 may suppress or limit the movement of the electrons 10 toward the interface 120a between the recombination induction layer 120 and the ferroelectric layer 130, by trapping electrons 10 and by combining electrons 10 and holes 30 in the recombination induction layer 120. Accordingly, the recombination induction layer 120 acts as a barrier and stops electrons 10 from changing the intensity or magnitude of the remanent polarization in the ferroelectric layer 130.

As described above, the ferroelectric memory device 1 according to an embodiment may additionally include the recombination induction layer 120 disposed between the interfacial insulation layer 110 and the ferroelectric layer 130 as compared with the ferroelectric memory device 2 illustrated in FIGS. 2 to 5. The recombination induction layer 120 may include holes acting as a majority carrier. Thus, while the ferroelectric memory device 1 operates in a write mode or a read mode, electrons moving from the substrate 101 toward the ferroelectric layer 130 may be combined with the holes in the recombination induction layer 120 before the electrons reach an interface between the ferroelectric layer 130 and any heterogeneous material layer contacting the ferroelectric layer 130. Accordingly, removal of migrating electrons in the recombination induction layer 120 limits or suppresses degradation of a fatigue characteristic of the ferroelectric memory device 1 and improves the reliability of the cell.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A ferroelectric memory device comprising:
a substrate;
an interfacial insulation layer disposed on the substrate;
a recombination induction layer disposed on the interfacial insulation layer;
a ferroelectric layer disposed on the recombination induction layer; and
a gate electrode disposed on the ferroelectric layer; and
a source region and a drain region disposed in the substrate and spaced apart from each other,
wherein the recombination induction layer includes a material containing holes acting as a majority carrier, and
wherein the recombination induction layer is electrically isolated from the source region and the drain region.

2. The ferroelectric memory device of claim 1, wherein the substrate includes a semiconductor material doped with P-type impurities.

3. The ferroelectric memory device of claim 1, wherein the interfacial insulation layer includes at least one selected from the group consisting of a silicon oxide (SiO) material, a silicon nitride (SiN) material, a silicon oxynitride (SiON) material and an aluminum oxide (AlO) material.

4. The ferroelectric memory device of claim 1, further comprising defect sites at an interface between the recombination induction layer and the ferroelectric layer.

5. The ferroelectric memory device of claim 4, wherein the recombination induction layer includes a metal oxide material having a nonstoichiometric composition or a PCMO(PrxCa1-xMnO3) material.

6. The ferroelectric memory device of claim 4, wherein the recombination induction layer includes a semiconductor material doped with P-type impurities.

7. The ferroelectric memory device of claim 6, wherein the semiconductor material includes at least one of a silicon (Si) material, a germanium (Ge) material, a gallium nitride (GaN) material and a gallium arsenide (GaAs) material.

8. The ferroelectric memory device of claim 1, wherein the ferroelectric layer includes at least one of a crystalline hafnium oxide material and a crystalline zirconium oxide material.

9. The ferroelectric memory device of claim 8,
wherein the ferroelectric layer is doped with impurities acting as a dopant; and
wherein the dopant in the ferroelectric layer includes at least one of carbon (C), silicon (Si), magnesium (Mg), aluminum (Al), yttrium (Y), germanium (Ge), tin (Sn), strontium (Sr), lead (Pb), calcium (Ca), barium (Ba), titanium (Ti), zirconium (Zr), gadolinium (Gd) and lanthanum (La).

10. The ferroelectric memory device of claim 1, wherein the gate electrode includes at least one of a tungsten (W) material, a titanium (Ti) material, a copper (Cu) material, an aluminum (Al) material, a platinum (Pt) material, an iridium (Ir) material, a ruthenium (Ru) material, a tungsten nitride (WN) material, a titanium nitride (TiN) material, a tantalum nitride (TaN) material, an iridium oxide (IrO) material, a ruthenium oxide (RuO) material, a tungsten carbide (WC) material, a titanium carbide (TiC) material, a tungsten silicide (WSi) material, a titanium silicide (TiSi) material and a tantalum silicide (TaSi) material.

11. The ferroelectric memory device of claim 1,
wherein the interfacial insulation layer is disposed on the substrate between the source region and the drain region, and wherein the recombination induction layer does not contact either the source region or the drain region.

12. A ferroelectric memory device comprising:
a semiconductor substrate;
a material layer disposed on the semiconductor substrate, wherein the material layer contains holes as a majority carrier;
a ferroelectric layer disposed on the material layer;
a gate electrode disposed on the ferroelectric layer; and
a source region and a drain region disposed in the semiconductor substrate to be spaced apart from each other,
wherein the material layer is disposed on the semiconductor substrate between the source region and the drain region, and
wherein the recombination induction layer is electrically isolated from the source region and the drain region.

13. The ferroelectric memory device of claim 12, further comprising an interfacial insulation layer disposed between the semiconductor substrate and the material layer,
wherein the interfacial insulation layer includes at least one selected from the group consisting of a silicon oxide (SiO) material, a silicon nitride (SiN) material, a silicon oxynitride (SiON) material and an aluminum oxide (AlO) material.

14. The ferroelectric memory device of claim 12, wherein the material layer includes a metal oxide material having a nonstoichiometric composition or a PCMO(PrxCa1-xMnO3) material.

15. The ferroelectric memory device of claim 12, wherein the substrate and the material layer includes a semiconductor material doped with P-type impurities acting as a dopant.

16. The ferroelectric memory device of claim 15, wherein the semiconductor material includes at least one of a silicon (Si) material, a germanium (Ge) material, a gallium nitride (GaN) material and a gallium arsenide (GaAs) material.

17. The ferroelectric memory device of claim 12, wherein the material layer is electrically floated.

18. A ferroelectric memory device comprising:
a silicon substrate doped with P-type impurities;
a silicon oxide layer disposed on the silicon substrate;
a semiconductor layer disposed on the silicon oxide layer and doped with P-type impurities acting as a dopant;
a ferroelectric layer disposed on the semiconductor layer;
a gate electrode disposed on the ferroelectric layer; and
a source region and a drain region disposed in the silicon substrate to be spaced apart from each other,
wherein the silicon oxide layer is disposed on the silicon substrate between the source region and the drain region,
wherein the semiconductor layer is configured to combine holes created by the dopant with electrons from the silicon substrate injected into the semiconductor layer, and
wherein the recombination induction layer is electrically isolated from the source region and the drain region.

19. The ferroelectric memory device of claim 18, wherein the semiconductor layer includes at least one of a silicon material, a germanium material, a gallium nitride material and a gallium arsenide material.

20. The ferroelectric memory device of claim 18, wherein the semiconductor layer is electrically floated.

* * * * *